(12) United States Patent
Onishi

(10) Patent No.: US 10,359,463 B2
(45) Date of Patent: Jul. 23, 2019

(54) ELECTRIC LEAKAGE DETECTING DEVICE

(71) Applicant: NEW JAPAN RADIO CO., LTD., Chuo-ku, Tokyo (JP)

(72) Inventor: Yu Onishi, Tokyo (JP)

(73) Assignee: NEW JAPAN RADIO CO., LTD., Chuo-Ku, Tokyo (JP)

( * ) Notice: Subject to any disclaimer, the term of this patent is extended or adjusted under 35 U.S.C. 154(b) by 317 days.

(21) Appl. No.: 15/478,786

(22) Filed: Apr. 4, 2017

(65) Prior Publication Data

US 2017/0285087 A1 Oct. 5, 2017

(30) Foreign Application Priority Data

Apr. 4, 2016 (JP) ................................. 2016-074850

(51) Int. Cl.
*G01R 31/00* (2006.01)
*G01R 31/02* (2006.01)
*G01R 35/00* (2006.01)
*H02H 1/00* (2006.01)
*H02H 3/16* (2006.01)
*H02H 3/33* (2006.01)

(52) U.S. Cl.
CPC ......... *G01R 31/025* (2013.01); *G01R 35/005* (2013.01); *H02H 1/0007* (2013.01); *H02H 3/162* (2013.01); *H02H 3/33* (2013.01); *H02H 1/0092* (2013.01)

(58) Field of Classification Search
CPC .. G01R 31/025; G01R 35/005; H02H 1/0007; H02H 3/162; H02H 3/33; H02H 1/0092
See application file for complete search history.

(56) References Cited

U.S. PATENT DOCUMENTS

| 5,600,523 A | * | 2/1997 | Park | H02H 1/04 |
|---|---|---|---|---|
| | | | | 361/42 |
| 2004/0136473 A1 | * | 7/2004 | Yang | H03D 3/007 |
| | | | | 375/322 |
| 2008/0112100 A1 | * | 5/2008 | Liu | H02H 3/33 |
| | | | | 361/45 |

FOREIGN PATENT DOCUMENTS

JP  1991-226225 A  10/1991
JP  2004-220859 A  8/2004

* cited by examiner

*Primary Examiner* — Pete T Lee
(74) *Attorney, Agent, or Firm* — Procopio, Cory, Hargreaves & Savitch LLP

(57) ABSTRACT

One embodiment provides an electric leakage detecting device for shutting off an AC electric circuit. A digital comparator generates a detection signal by comparing an output signal corresponding to output signals of a zero-phase current transformer with positive and negative thresholds, a control signal generator generates a control signal based on the detection signal, and a judging device generates a judgment signal if an electric leakage state is judged. In addition, a delay counter generates a final control signal if the judgment signal has been received continuously more than a first prescribed time, a reset counter resets every time the control signal is received, and resets the judging device and the delay counter if the control signal is not received in a second prescribed time, and a switch driving circuit shuts off the AC electric circuit based on the final control signal.

7 Claims, 12 Drawing Sheets

ELECTRIC LEAKAGE DETECTING DEVICE

CROSS-REFERENCE TO RELATED APPLICATION(S)

This application claims priority from Japanese Patent Application No. 2016-074850 filed on Apr. 4, 2016, the entire contents of which are incorporated herein by reference.

FIELD

Embodiments described herein relate to an electric leakage detecting device which suppresses erroneous detection of high-frequency noise, a surge, and an abnormal waveform by a ground-fault interrupter for shutting off an AC electric circuit.

BACKGROUND

Also electric leakage detecting devices for shutting off AC electric circuits may detect respective peak values of positive and negative output signals of a zero-phase current transformer that are proportional to a ground-fault current, determine positive and negative signal widths from positive and negative peak value signals, integrate the positive and negative signal width signals, and output a trip control signal based on integration results of the positive and negative signals to operate a ground-fault interrupter (refer to JP-1991-226225-A, for example).

Electric leakage detecting devices may be equipped with a computing circuit which converts an output signal of a zero-phase current transformer that is proportional to a ground-fault current into a pulse signal by an integration circuit and a VF (voltage-frequency) conversion circuit and generates a trip control signal for shutting off an AC electric circuit if an integration value of the pulse signal is larger than or equal to a prescribed value (refer to JP-2004-220859-A, for example).

According to the above-kinds of electric leakage detecting devices, an undesirable operation is caused due to erroneous detection when harmonic noise or a surge is superimposed on an output signal of the zero-phase current transformer. Furthermore, detection of a signal level that is proportional to a ground-fault current requires an analog comparator and cannot be given high detection accuracy because the detection accuracy depends on the accuracy of the analog comparator. Still further, no indication is provided as to how to detect a leakage current having a load-rectified waveform.

SUMMARY

One object of the present invention is to provide an electric leakage detecting device capable of suppressing erroneous detection due to harmonic noise, a surge, or an abnormal waveform and performing high-accuracy detection even on an electric leakage waveform including a load-rectified waveform.

The invention provides following Aspects 1-7.

1. An electric leakage detecting device for shutting off an AC electric circuit by detecting a ground-fault current occurring in the AC electric circuit by a zero-phase current transformer, the electric leakage detecting device including:

an A/D converter which analog-to-digital-converts a difference signal between positive and negative output signals of the zero-phase current transformer;

a digital filter which extracts low-frequency components of a digital signal that is output from the A/D converter;

a digital comparator which generates a detection signal by comparing an output signal of the digital filter with the positive threshold and the negative threshold;

a trip control signal generator which generates a positive trip control signal or a negative trip control signal based on the detection signal output from the digital comparator;

an electric leakage judging device which judges whether the AC electric circuit is in an electric leakage state based on the positive trip control signal and the negative trip control signal, and generates an electric leakage judgment signal if judging that the AC electric circuit is in the electric leakage state;

a delay counter which generates a final trip control signal if the electric leakage judgment signal has been received continuously from the electric leakage judging device more than a first prescribed time;

a reset signal generation counter which is reset every time the positive trip control signal of the negative trip control signal is received from the trip control signal generator, and resets the electric leakage judging device and the delay counter if neither the positive trip control signal nor the negative trip control signal is received in a second prescribed time after being reset; and a switch driving circuit which shuts off the AC electric circuit when the final trip control signal is received from the delay counter.

2. The electric leakage detecting device of Aspect 1, wherein the digital filter eliminates frequency components that are higher than a main frequency of the AC electric circuit.

3. The electric leakage detecting device of Aspect 1 or 2, wherein the digital comparator generates, as the detection signal, a positive-threshold-excess detection signal when the output signal of the digital filter is larger than the positive threshold, and a negative-threshold-excess detection signal when the output signal of the digital filter is smaller than the negative threshold, wherein the trip control signal generator includes a time measuring unit, and generates the positive trip control signal if the time measuring unit detects that the positive-threshold-excess detection signal has been received continuously for a third prescribed time, and the negative trip control signal if the time measuring unit detects that the negative-threshold-excess detection signal has been received continuously for the third prescribed time, and wherein the electric leakage judging device generates the electric leakage judgment signal if the positive trip control signal and the negative trip control signal are received from the trip control signal generator in an order of the positive trip control signal, the negative trip control signal and the positive trip control signal, or in an order of the negative trip control signal, the positive trip control signal and the negative trip control signal.

4. The electric leakage detecting device of Aspect 3, wherein the trip control signal generator is reset into a standby state to wait for input of the positive-threshold-excess detection signal or the negative-threshold-excess detection signal if the negative-threshold-excess detection signal is received after generation of the positive trip control signal, or if the positive-threshold-excess detection signal is received after generation of the negative trip control signal.

5. The electric leakage detecting device of Aspect 1 or 2,
wherein the digital comparator generates, as the detection signal,
   a positive-threshold-excess detection signal when the output signal of the digital filter is larger than the positive threshold, and
   a negative-threshold-excess detection signal when the output signal of the digital filter is smaller than the negative threshold,
   wherein the trip control signal generator includes a time measuring unit, and generates
      the positive trip control signal if the time measuring unit detects that the positive-threshold-excess detection signal has been received continuously for a third prescribed time, and
      the negative trip control signal if the time measuring unit detects that the negative-threshold-excess detection signal has been received continuously for the third prescribed time, and
   wherein the electric leakage judging device generates the electric leakage judgment signal if
      the positive trip control signal is received successively twice from the trip control signal generator, or
      the negative trip control signal is received successively twice from the trip control signal generator.
6. The electric leakage detecting device of Aspect 5,
   wherein the digital comparator further includes a second positive threshold that is smaller than the positive threshold and a second negative threshold that is larger than the negative threshold, and generates
      a second-positive-threshold-excess detection signal when the output signal of the digital filter is larger than the second, positive threshold, or
      a second-negative-threshold-excess detection signal when the output signal of the digital filter is smaller than the second negative threshold, and
   wherein the trip control signal generator is reset into a standby state to wait for input of the positive-threshold-excess detection signal or the negative-threshold-excess detection signal, if the second-positive-threshold-excess detection signal is not received after generation of the positive trip control signal, or if the second-negative-threshold-excess detection signal is not received after generation of the negative trip control signal.
7. The electric leakage detecting device of any one of Aspects 3 to 6,
   wherein the digital comparator further generates
   a between-thresholds detection signal when the output signal of the digital filter is between the positive threshold and the negative threshold, and
   wherein the trip control signal generator is
   switched into a detection state to start measurement of a continuation time of the negative-threshold-excess detection signal with the time measuring unit being reset, if the detection signal of the digital comparator is changed from the positive-threshold-excess detection signal to the negative-threshold-excess detection signal before the time measuring unit detects a lapse of the third prescribed time,
   switched into a detection state to start measurement of a continuation time of the positive-threshold-excess detection signal with the time measuring unit being reset, if the detection signal of the digital comparator is changed from the negative-threshold-excess detection signal to the positive-threshold-excess detection signal before the time measuring unit detects a lapse of the third prescribed time, and
   reset into a standby state to wait for input of the positive-threshold-excess detection signal or the negative-threshold-excess detection signal if the detection signal of the digital comparator is changed from the positive-threshold-excess detection signal or the negative-threshold-excess detection signal to the between-thresholds detection signal.

According to the above-mentioned configurations, since high-frequency components that are higher than the main frequency of the AC electric circuit can be eliminated by the digital filter from an A/D-converted version of a difference signal between positive and negative output signals of the zero-phase current transformer, high-frequency noise or a surge can be eliminated before a judgment by the electric leakage judging device, and hence occurrence of an erroneous operation due to high-frequency noise or a surge can be suppressed. Since the level of a ground-fault current is detected by the digital comparator through comparison with the thresholds, the detection characteristic can be made more accurate than in a case that comparison with thresholds is made by an analog comparator.

Since whether an electric leakage has occurred or not is judged by examining how the positive trip control signal and the negative trip control signal vary by the trip control signal generator and the electric leakage judging device, erroneous detection of an abnormal waveform caused by a factor other than an electric leakage can be suppressed. Furthermore, since the A/D converter and the circuits downstream of it are logic circuits, the power consumption of the device can be made lower than in devices which employ plural analog comparators or integration circuits.

BRIEF DESCRIPTION IF THE DRAWINGS

DETAILED DESCRIPTION

Embodiment 1

Figure 1:
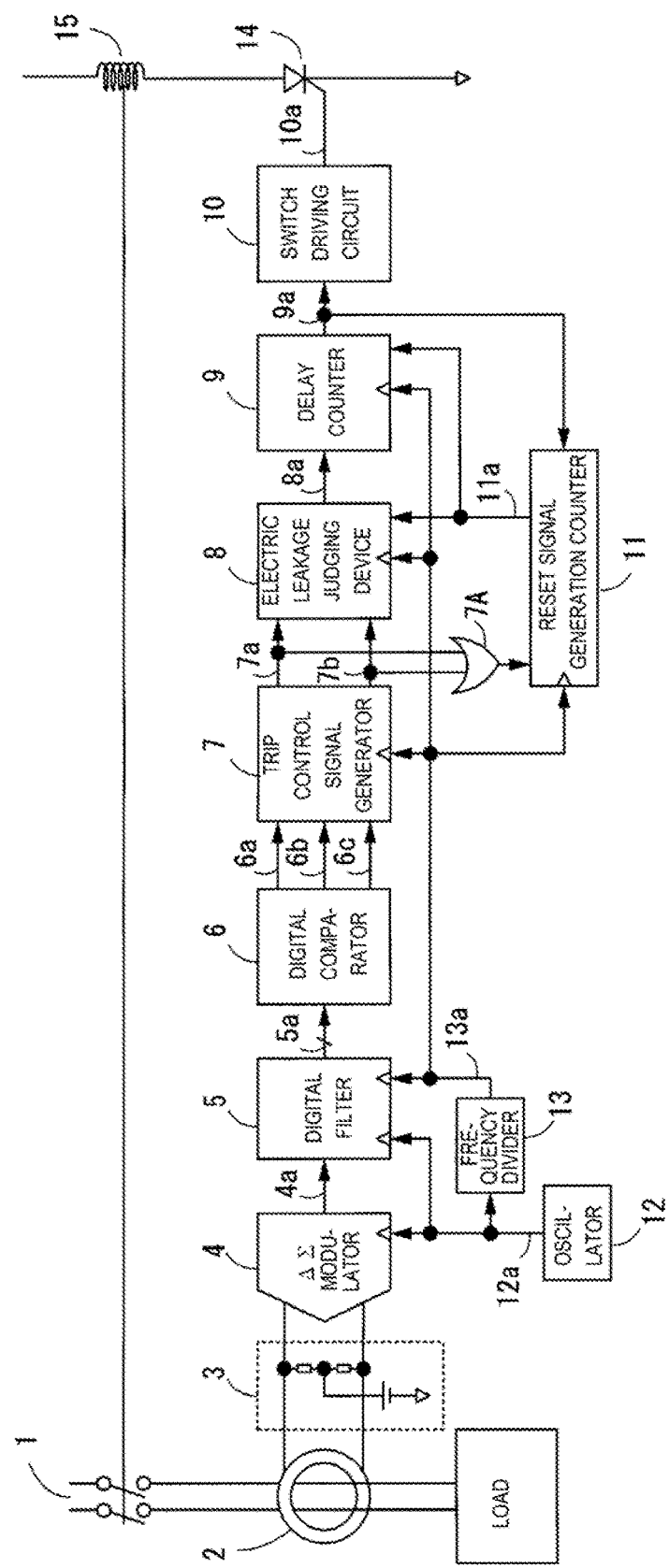
FIG. 1 is a block diagram of an electric leakage detecting device according to a first embodiment.

FIG. 1 shows an electric leakage detecting device according to a first embodiment. Reference numerals 1, 2, and 4 denote an AC electric circuit, a zero-phase current transformer, and a $\Delta\Sigma$ modulator as an "A/D converter", respectively. The $\Delta\Sigma$ modulator 4 receives a difference signal between secondary-side positive and negative output signals of the zero-phase current transformer 2 and performs $\Delta\Sigma$ modulation on it to output a PDM (pulse density modulation) signal 4a. Reference numeral 3 denotes a has circuit which gives a common-mode voltage suitable for the $\Delta\Sigma$ modulator 4 to the secondary side of the zero-phase current transformer 2. Reference numeral 5 denotes a digital filter which receives the PDM signal 4a from the $\Delta\Sigma$ modulator 4 and has a lowpass filter characteristic for eliminating frequency components (noise, a surge, etc.) having frequencies that are higher than a main frequency of the AC electric circuit 1.

Reference numeral 6 denotes a digital comparator which compares digital data 5a that is output from the digital filter 5 with thresholds (described later) and thereby generates a detection signal 6a, 6b, or 6c. Reference numeral 7 denotes a trip control signal generator which takes in the detection signal 6a, 6b, or 6c that is output from the digital comparator 6 and generates a positive trip control signal 7a or a negative trip control signal 7b under prescribed conditions.

Reference numeral 8 denotes an electric leakage judging device which judges that an electric leakage has occurred and outputs an electric leakage judgment signal 8a if trip control signals 7a and 7b have been output from the trip control signal generator 7 in prescribed order. Reference numeral 9 denotes a delay counter which generates a final trip control signal 9a when the electric leakage judgment signal 8a has been output from the electric leakage judging device 8 continuously for a first prescribed time.

Reference numeral 11 denotes a reset signal generation counter which generates a reset signal 11a for resetting the electric leakage judging device 8 and the delay counter 9 if not receiving a positive trip control signal 7a or a negative trip control signal 7b again in a second prescribed time from reception of a positive trip control signal 7a or a negative trip control signal 7b from the trip control signal generator 7 via an OR circuit 7A. The reset signal generation counter 11 suspends its reset signal generating function until shutoff of the AC electric circuit 1 upon receiving the final trip signal 9a from the delay counter 9.

Reference numeral 12 denotes an oscillation circuit which supplies a clock signal 12a to the $\Delta\Sigma$ modulator 4 and the digital filter 5. Reference numeral 13 denotes a frequency divider which generates a clock signal 13a by frequency-dividing the clock signal 12a which is output from the oscillator 12. The frequency divider 13 supplies the clock signal 13a to the digital filter 5 for the purpose of downsampling, and also supplies the clock signal 13a to the trip control signal generator 7, the electric leakage judging device 8, the delay counter 9, and the reset signal generation counter 11.

Reference numeral 15 denotes a ground-fault interrupter for shutting off the AC electric circuit 1. Reference numeral 14 denotes a switching element such as a thyristor for driving the ground-fault interrupter 15. Reference numeral 10 denotes a switch driving circuit for driving the switching element 14 using the final trip control signal 9a which is output from the delay counter 9.

Figure 2:
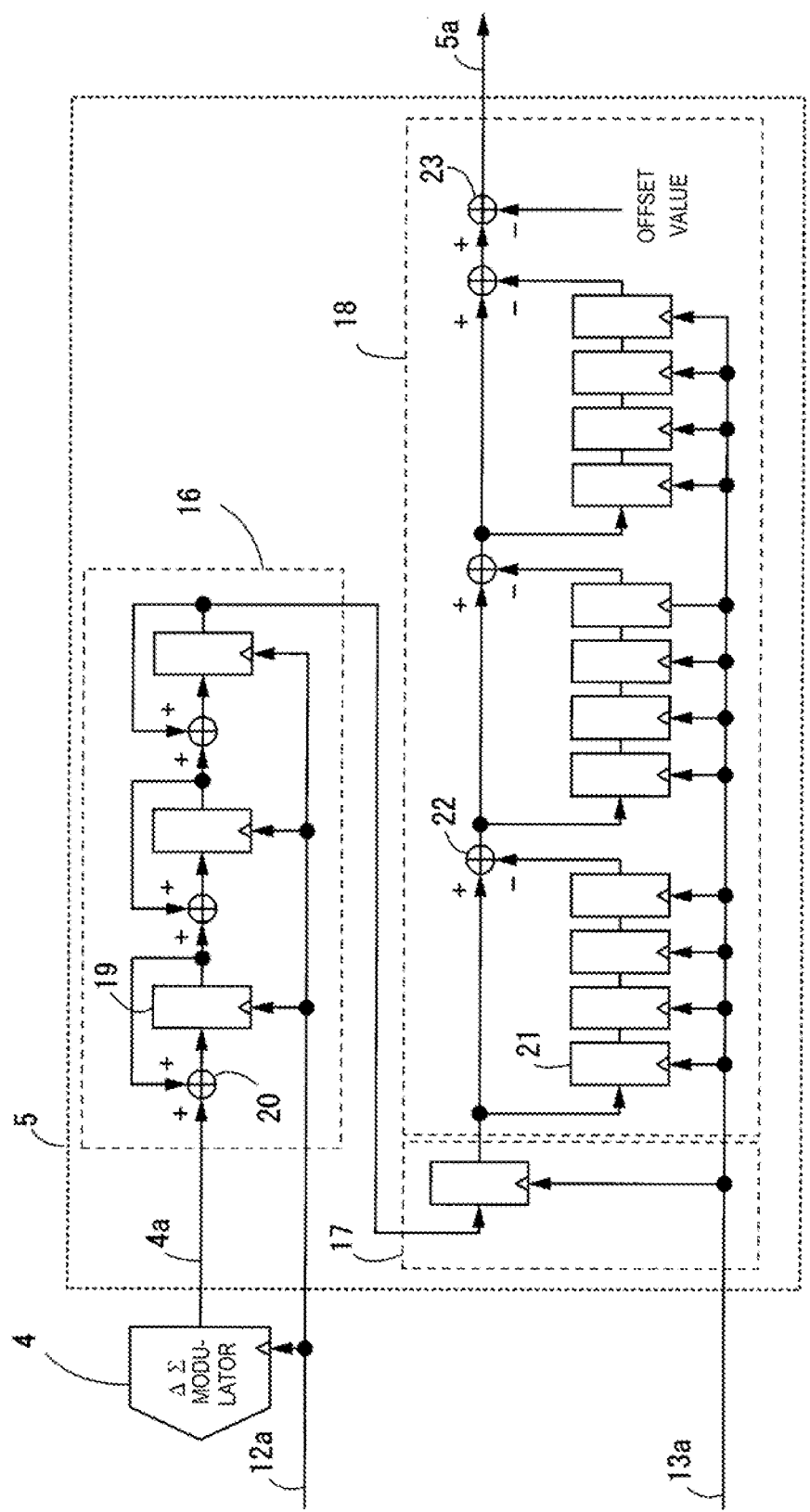
FIG. 2 is a circuit diagram of a digital filter of the electric leakage detecting device shown in FIG. 1.

FIG. 2 mainly shows the configuration of the digital filter 5. The digital filter 5 is a CIC (cascaded integration-comb) filter and is composed of an integration unit 16, a downsampling unit 17, and a comb filter unit 18.

The integration unit 16 is a cascade connection of three stages of a flip-flop 19 and an adder 20 that is connected to the data input side of the flip-flop 19. Like the $\Delta\Sigma$ modulator 4, the flip-flops 19 are driven by the clock signal 12a of the oscillator 12.

The downsampling unit 17 is one flip-flop. The comb filter unit 18, which is disposed downstream of the downsampling unit 17, is a cascade connection of three stages of a cascade connection of four flip-flops 21 and one subtractor 22 that is disposed on the output side of the last flip-flop 21. The flip-flop of the downsampling unit 17 and the flip-flops 21 of the comb filter unit 18 are driven by the clock signal 13a of the frequency divider 13. A subtractor 23 which subtracts an offset value to make the output signal 5a of the digital filter 5 equal to zero when the difference voltage between the positive and negative output signals of the zero-phase current transformer 2 is equal to zero is disposed at the end of the digital filter 5.

Figure 3:
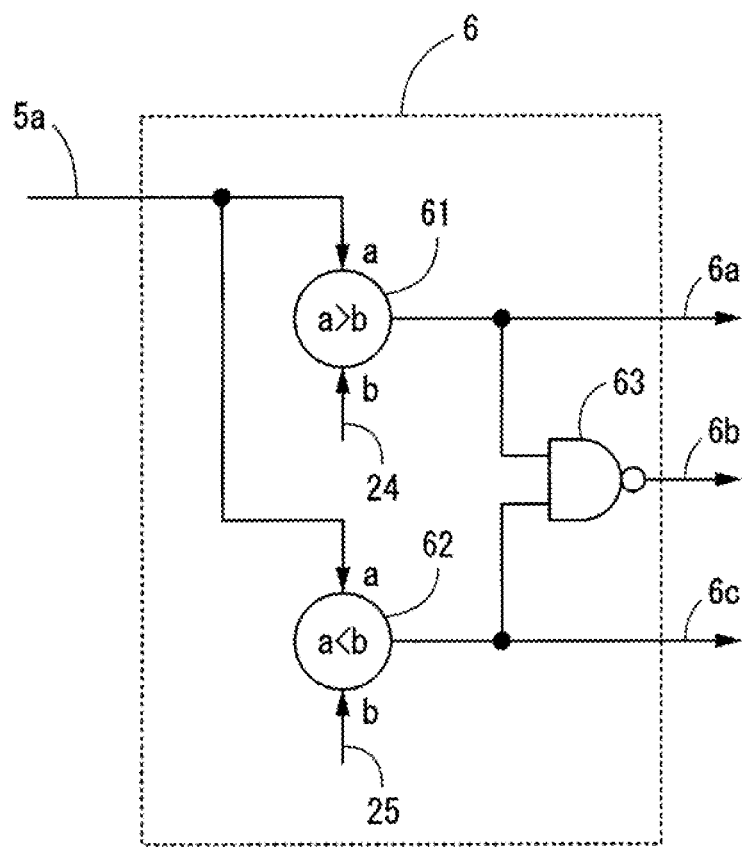
FIG. 3 is a diagram showing the configuration of a digital comparator of the electric leakage detecting device shown in FIG. 1.

FIG. 3 shows the configuration of the digital comparator 6. The digital comparator 6 is a window comparator composed of digital comparators 61 and 62 and a NAND gate 63, and receives the output signal 5a of the digital filter 5. The digital comparator 6 outputs a positive-threshold-excess detection signal 6a, a negative-threshold-excess detection signal 6c, and a between-thresholds detection signal 6b if the level of the output signal 5a is higher than a positive threshold 24, lower than a negative threshold 25, and between the positive threshold 24 and the negative threshold 25, respectively.

Figure 4:
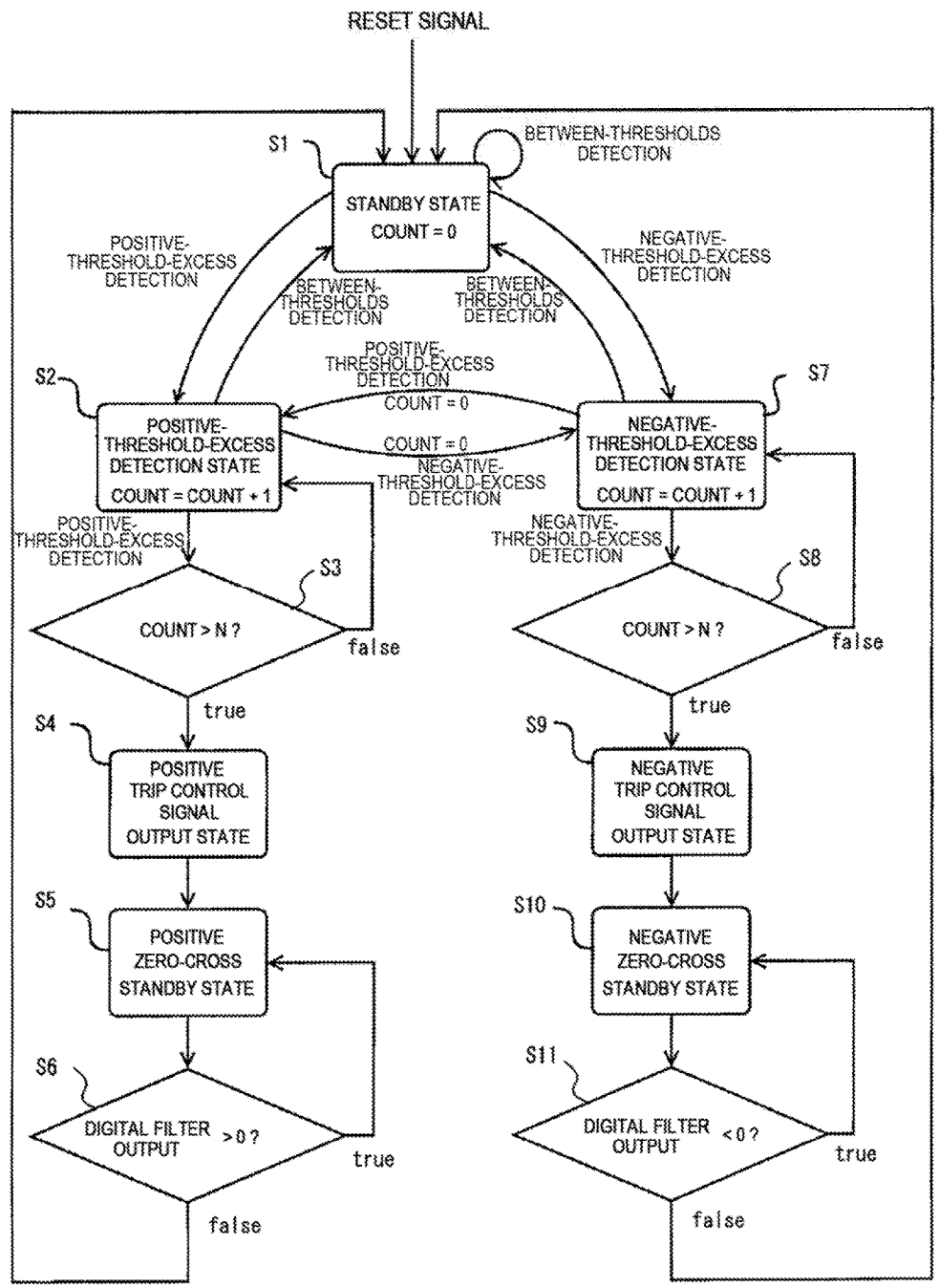
FIG. 4 is a state transition diagram of a trip control signal generator of the electric leakage detecting device shown in FIG. 1.

FIG. 4 is a state transition diagram of a state machine that is part of the trip control signal generator 7. The trip control signal generator 7 is composed of the state machine shown in FIG. 4 and a built-in counter (which counts pulses of the clock signal 13a) as a time measuring unit that is controlled by the state machine. The trip control signal generator 7 is controlled by the positive-threshold-excess detection signal 6a, the between-thresholds detection signal 6b, and the negative-threshold-excess detection signal 6c of the digital comparator 6. The count of the built-in counter is made "0" (state S1) when a reset signal 11a which is output from the reset signal generation counter 11 is reset.

Upon input of a positive-threshold-excess detection signal 6a, a transition is made to a positive-threshold-excess detection state S2 and the count of the built-in counter is incremented by "1." If it is judged at step S3 that the positive-threshold-excess detection signal 6a has been input continuously for a period (third prescribed time) when the built-in counter has counted up N times, a transition is made to a positive trip control signal output state S4 and a positive trip control signal 7a is output there. And a transition is made to a positive zero-cross standby state S5. This operation has an effect of suppressing erroneous detection of a short-pulse-width signal (the built-in counter counts up less than N times) that has passed the digital filter 5.

The positive zero-cross standby state S5 is maintained until it is judged at step S6 that the digital filter 5 outputs a negative output signal 5a (i.e., until input of a negative-threshold-excess detection signal 6c). Upon input of a negative-threshold-excess detection signal 6c, the built-in counter is reset to "0" and a transition is made to the standby state S1.

Upon input of a negative-threshold-excess detection signal 6c, a transition is made to a negative-threshold-excess detection state S7 and the count of the built-in counter is incremented by "1". If it is judged at step S8 that the negative-threshold-excess detection signal 6c has been input continuously for a period (third prescribed time) when the built-in counter has counted up N times, a transition is made to a negative trip control signal output state S9 and a negative trip control signal 7b is output there. And a transition is made to a negative zero-cross standby state S10. This operation also has an effect of suppressing erroneous detection of a short-pulse-width signal (the built-in counter counts up less than N times) that has passed the digital filter 5.

The negative zero-cross standby state S10 is maintained until it is judged at step S11 that the digital filter 5 outputs a negative output signal 5a (i.e., until input of a positive-threshold-excess detection signal 6a). Upon input of a positive-threshold-excess detection signal 6a, the built-in counter is reset to "0" and a transition is made to the standby state S1.

If a negative-threshold-excess detection signal 6c is input in the positive-threshold-excess detection state S2, the built-in counter is reset to "0" and a transition is made to the negative-threshold-excess detection state S7. If a positive-threshold-excess detection signal 6a is input in the negative-threshold-excess detection state S7, the built-in counter is reset to "0" and a transition is made to the positive-threshold-excess detection state S2. If a between-thresholds detection signal 6b is input in the positive-threshold-excess detection state S2 or the negative-threshold-excess detection state S7, the built-in counter is reset to "0" and a transition is made to the standby state S1.

The above-described operation provides an effect of suppressing erroneous detection due to, for example, a DC to low-frequency component signal that cannot be eliminated by the digital filter 5 disposed upstream, other than a ground-fault signal.

Figure 5:
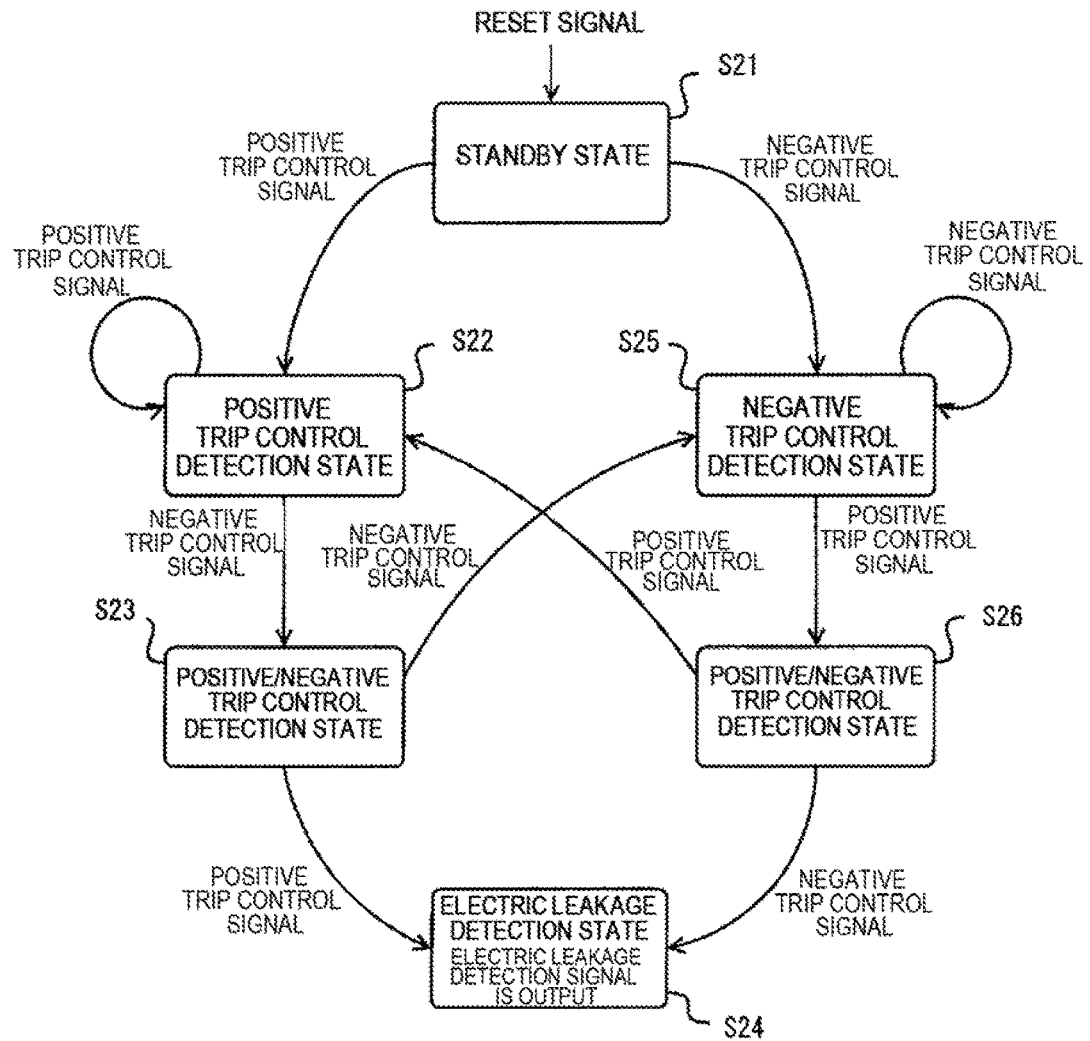
FIG. 5 is a state transition diagram of an electric leakage judging device of the electric leakage detecting device shown in FIG. 1.

FIG. 5 is a state transition diagram of a state machine that constitutes the electric leakage judging device 8. The electric leakage judging device 8 is controlled by the positive trip control signal 7a and the negative trip control signal 7b which are output from the trip control signal generator 7.

In this state machine, a transition is made from a standby state S21 to a positive trip control detection state S22 when a positive trip control signal 7a is generated. If a negative trip control signal 7b is generated thereafter, a transition is made to a positive/negative trip control detection state S23. When a positive trip control signal 7a is generated again, a transition is made to an electric leakage detection state S24 and the electric leakage judging device 8 outputs an electric leakage judgment signal 8a.

On the other hand, a transition is made from the standby state S21 to a negative trip control detection state S25 when a negative trip control signal 7b is generated. If a positive trip control signal 7a is generated thereafter, a transition is made to a positive/negative trip control detection state S26. When a negative trip control signal 7b is generated again, a transition is made to the electric leakage detection state S24 and the electric leakage judging device 8 outputs an electric leakage judgment signal 8a.

When a negative trip control signal 7b is generated again in the positive/negative trip control detection state S23, a transition is made to the negative trip control detection state S25. When a positive trip control signal 7a is generated again in the positive/negative trip control detection state S26, a transition is made to the positive trip control detection state S22.

As described above, the electric leakage judging device 8 makes a transition to the electric leakage detection state S24 and outputs an electric leakage judgment signal 8a only when trip control signals 7a and 7b are generated in particular order, that is, "positive"→"negative"→"positive" or "negative"→"positive"→"negative". After the transition to the electric leakage detection state S24, the electric leakage detection state S24 is maintained until generation of a reset signal 11a by the reset signal generation counter 11.

Figure 6:
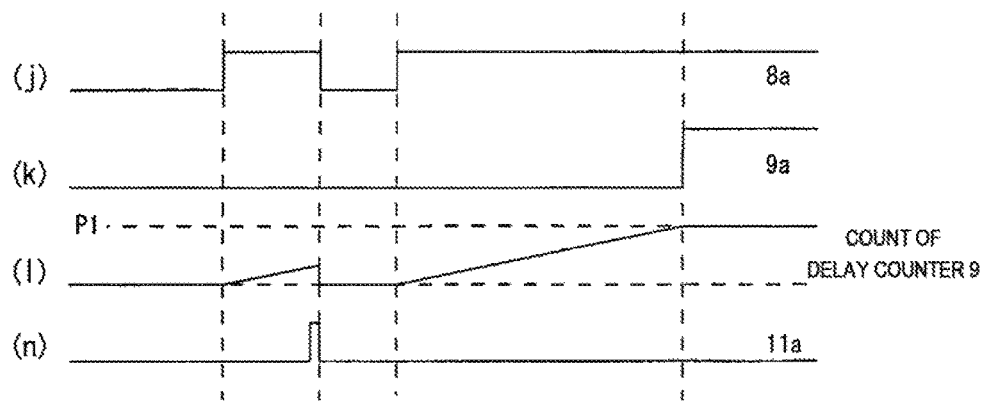
FIG. 6 is a timing chart illustrating how a delay counter of the electric leakage detecting device shown in FIG. 1 operates.

FIG. 6 is a timing chart illustrating how the delay counter 9 operates. When receiving an electric leakage judgment signal 8a as shown in part (j) of FIG. 6, as shown in part (l) of FIG. 6 the delay counter 9 counts pulses of the clock signal 13a from detection of the rising edge of the electric leakage judgment signal 8a. If the count reaches P1 (if the first prescribed time has lapsed), the delay counter 9 outputs a final trip control signal 9a as shown in part (k) of FIG. 6. The final trip control signal 9a drives the switch driving circuit 10 and causes the reset signal generation counter 11 to suspend its functioning. As shown in part (n) of FIG. 6, the delay counter 9 is reset by a reset signal 11a which is output from the reset signal generation counter 11.

Figure 7:
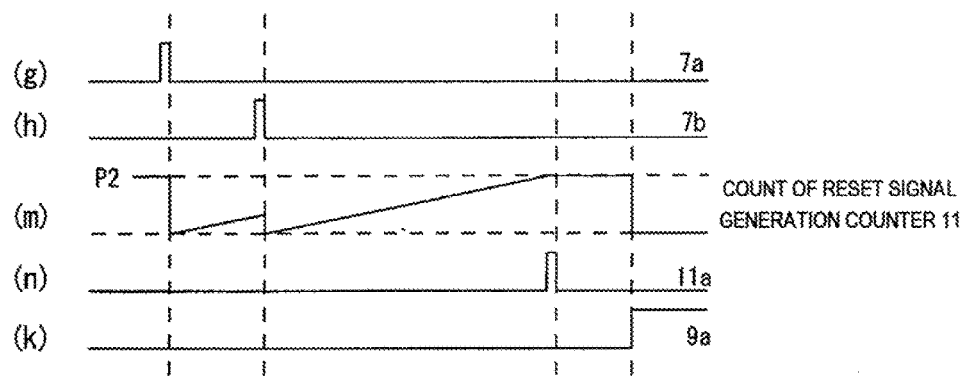
FIG. 7 is a timing chart illustrating how a reset signal generation counter of the electric leakage detecting device shown in FIG. 1 operates.

FIG. 7 is a timing chart illustrating how the reset signal generation counter 11 operates. As shown in part (m) of FIG. 7, the reset signal generation counter 11 counts pulses of the clock signal 13a until the count reaches P2 (until the second prescribed time has lapsed). If the count reaches P2, the reset signal generation counter 11 outputs a reset signal 11a as a one-shot pulse as shown in part (n) of FIG. 7. After outputting the reset signal 11a, the reset signal generation counter 11 suspends its operation until occurrence of a positive trip control signal 7a or a negative trip control signal 7b. Upon receiving a positive trip control signal 7a (see part (g) of FIG. 7) or a negative trip control signal 7b (see part (h) of FIG. 7), the reset signal generation counter 11 is reset and restarts counting.

After the delay counter 9 outputs the final trip control signal 9a as shown in part (k) of FIG. 7, the reset signal generation counter 11 suspends its reset signal generating function until the AC electric circuit 1 is shut off. As described above, the electric leakage judging device 8 and the delay counter 9 are reset by a reset signal 11a generated by the reset signal generation counter 11.

This operation allows the electric leakage judging device 8 to make an electric leakage judgment only on a waveform that occurs in the second prescribed time (corresponding to the count P2 of the counter 11), and provides an effect of suppressing erroneous detection due to sporadic abnormal signals that occur with an interval more than the second prescribed time.

Figure 8:
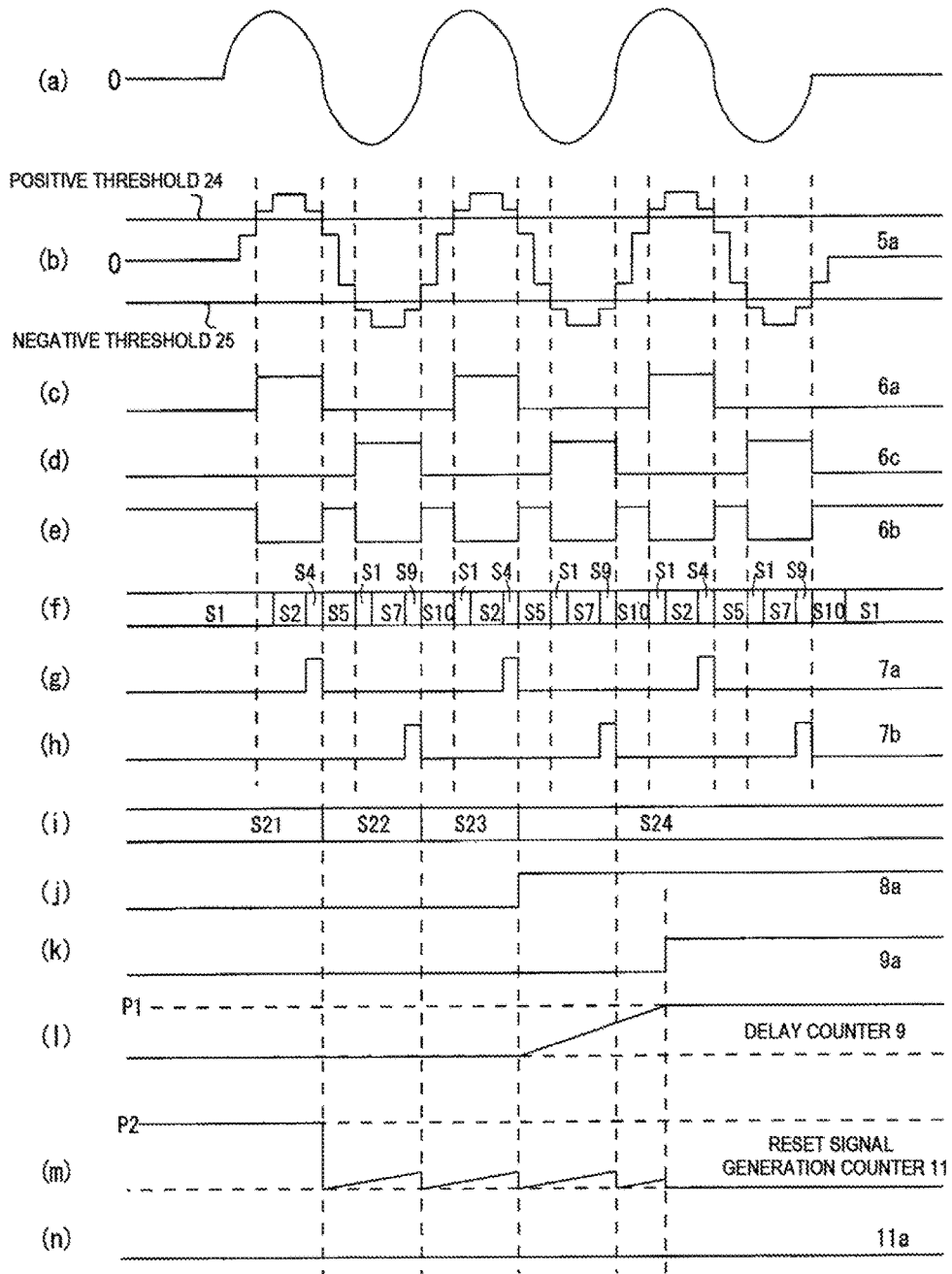
FIG. 8 is a timing chart illustrating an electric leakage detecting operation of the electric leakage detecting device shown in FIG. 1 in an ordinary state.

Next, how the electric leakage detecting device shown in FIG. 1 operates will be described with reference to timing charts of FIGS. 8 and 9. FIG. 8 is a timing chart illustrating an electric leakage detecting operation in an ordinary state. Part (a) of FIG. 8 shows a difference voltage between positive and negative output signals of the zero phase current transformer 2 that is proportional to a ground-fault current occurring in the AC electric circuit 1. Part (b) of FIG. 8 shows an output signal 5a of the digital filter 5 that is generated through modulation by the ΔΣ modulator 4 and processing by the digital filter 5.

The digital comparator 6 outputs a positive-threshold-excess detection signal 6a shown in part (c) of FIG. 8, a negative-threshold-excess detection signal 6c shown in part (d) of FIG. 8, and a between-thresholds detection signal 6b shown in part (e) of FIG. 8 if the output signal 5a of the digital filter 5 is larger than the positive threshold 24, smaller than the negative threshold 25, and between the positive threshold 24 and the negative threshold 25, respectively.

The output signals 6a, 6b, and 6c of the digital comparator 6 cause the state machine of the trip control signal generator 7 to make transitions shown in part (f) of FIG. 8.

Since the state machine of the trip control signal generator 7 makes transitions as shown in FIG. 4, the trip control signal generator 7 outputs, as a pulse signal, a positive trip control signal 7a shown in part (g) of FIG. 8 if detecting excess over the positive threshold 24 that lasts the third prescribed time (corresponding to a count N of pulses of the clock signal 13a) and outputs a negative trip control signal 7b shown m part (h) of FIG. 8 if detecting excess over the negative threshold 25 that lasts the third prescribed time.

The trip control signals 7a and 7b cause the state machine of the electric leakage judging device 8 to make transitions shown in part (i) of FIG. 8. Since the state machine of the electric leakage judging device 8 makes transitions in the manner shown in FIG. 5, a transition is made to the electric leakage detection state S24 if positive trip control signals 7a and negative trip control signals 7b are generated in particular order ("positive"→"negative"→"positive" or "negative"→"positive"→"negative") and an electric leakage judgment signal 8a is output as shown in part (j) of FIG. 8.

Upon the reception of the electric leakage judgment signal 8a, the delay counter 9 starts counting as shown in part (l) of FIG. 8. When the count reaches P1 (corresponding to the first prescribed time), the delay counter 9 outputs a final trip control signal 9a as shown in part (k) of FIG. 8. Setting the maximum count of the delay counter 9 at P1 makes it possible to easily set a time (delay time) from generation of an electric leakage judgment signal 8a to shutoff of the AC electric circuit 1.

As shown in part (m) of FIG. 8, reset by the trip control signals 7a and 7b shown in parts (g) and (h) of FIG. 8, as shown in part (n) of FIG. 8 the reset signal generation counter 11 generates no reset pulse 11a. The switch driving circuit 10 is driven by the final trip control signal 9a that is generated in the above-described manner, the switching element 14 is turned on, and the ground-fault interrupter 15 shuts off the AC electric circuit 1.

Figure 9:
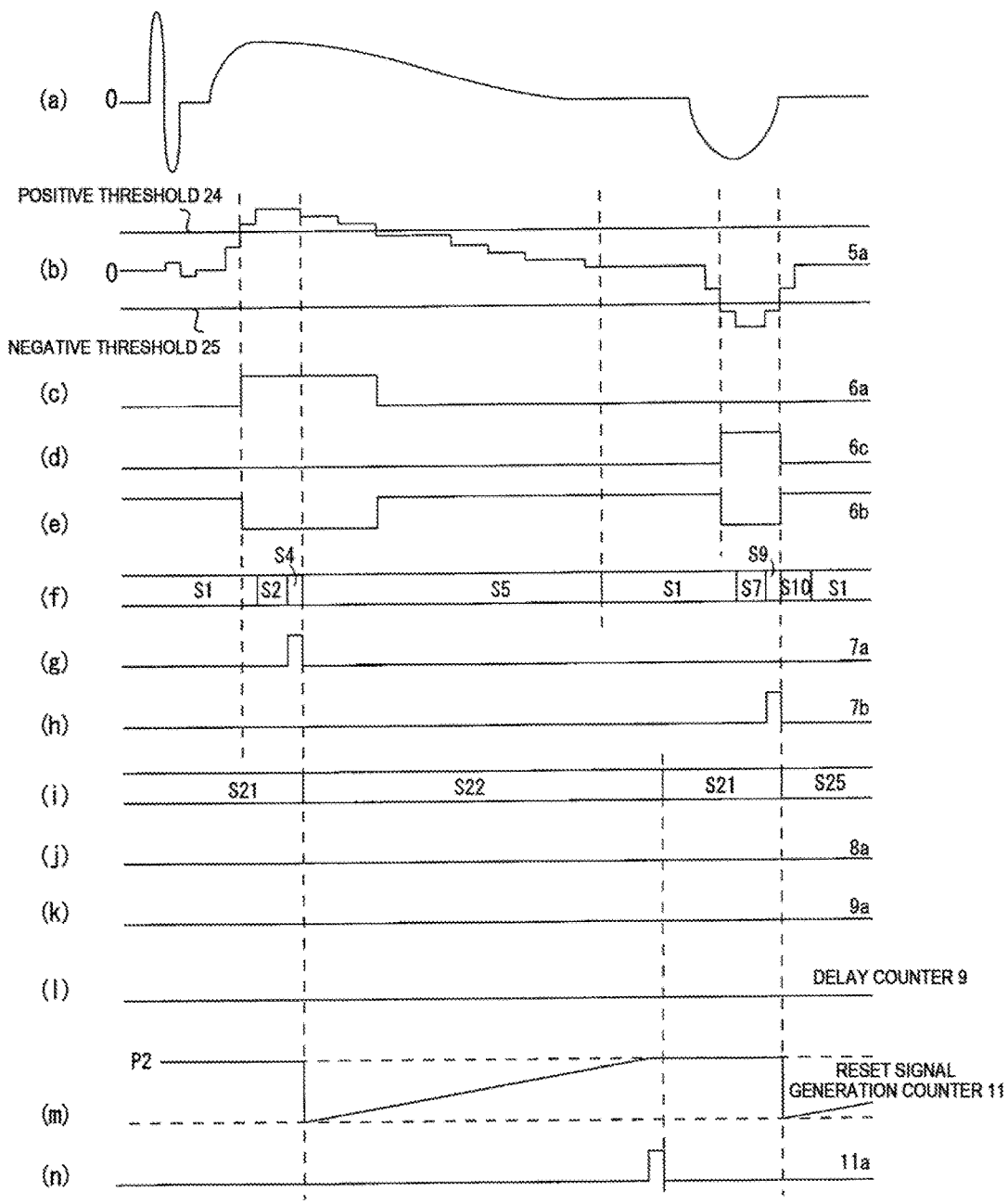
FIG. 9 is a timing chart illustrating an electric leakage detecting operation of the electric leakage detecting device shown in FIG. 1 at the occurrence of an abnormal waveform.

FIG. 9 is a timing chart illustrating an operation that is performed in response to input of an abnormal waveform from the zero-phase current transformer 2. Part (a) of FIG. 9 shows an abnormal waveform that occurs between positive and negative output signals of the zero-phase current transformer 2 due to a cause other than an electric leakage. Part (b) of FIG. 9 shows an output signal 5a of the digital filter 5. Since the output signals of the zero-phase current transformer 2 are subjected to lowpass filter processing in the digital filter 5, high-frequency components are suppressed and hence a strong effect of eliminating such inputs as a surge.

When trip control signals 7a and 7b are generated as shown in parts (g) and (h) of FIG. 8, state transitions occur in the electric leakage judging device 8 in a manner shown in part (i) of FIG. 9. However, the electric leakage judging device 8 can return to the initial state when the reset signal generation counter 11 has counted P2 pulses of the clock signal 13a as shown in part (m) of FIG. 9. Thus, waveforms as shown in part (a) of FIG. 9 do not cause any undesirable operation such as shutoff of the AC electric circuit 1.

Embodiment 2

Figure 10:
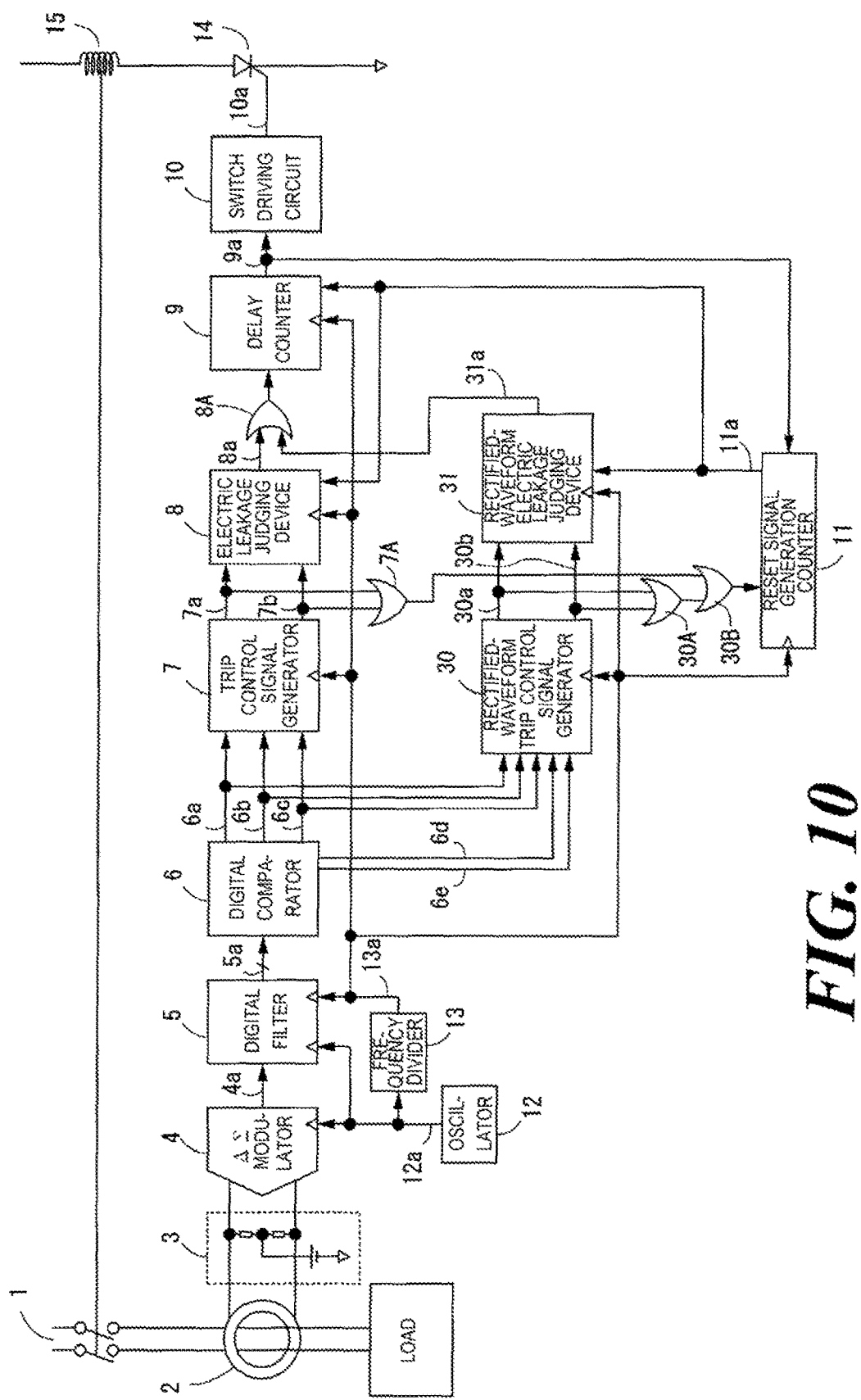
FIG. 10 is a block diagram of an electric leakage detecting device according to a second embodiment.

FIG. 10 shows an electric leakage detecting device according to a second embodiment. The electric leakage detecting device according the second embodiment is different in configuration from that according to the first embodiment in that the former is added with a rectified-waveform trip control signal generator 30 and a rectified-waveform electric leakage judging device 31 which operate receiving a clock signal 13a. The electric leakage detecting device according the second embodiment has a function of detecting an electric leakage even in a case that a ground-fault current assumes a rectified waveform because of an inverter load or the like.

Figure 13:
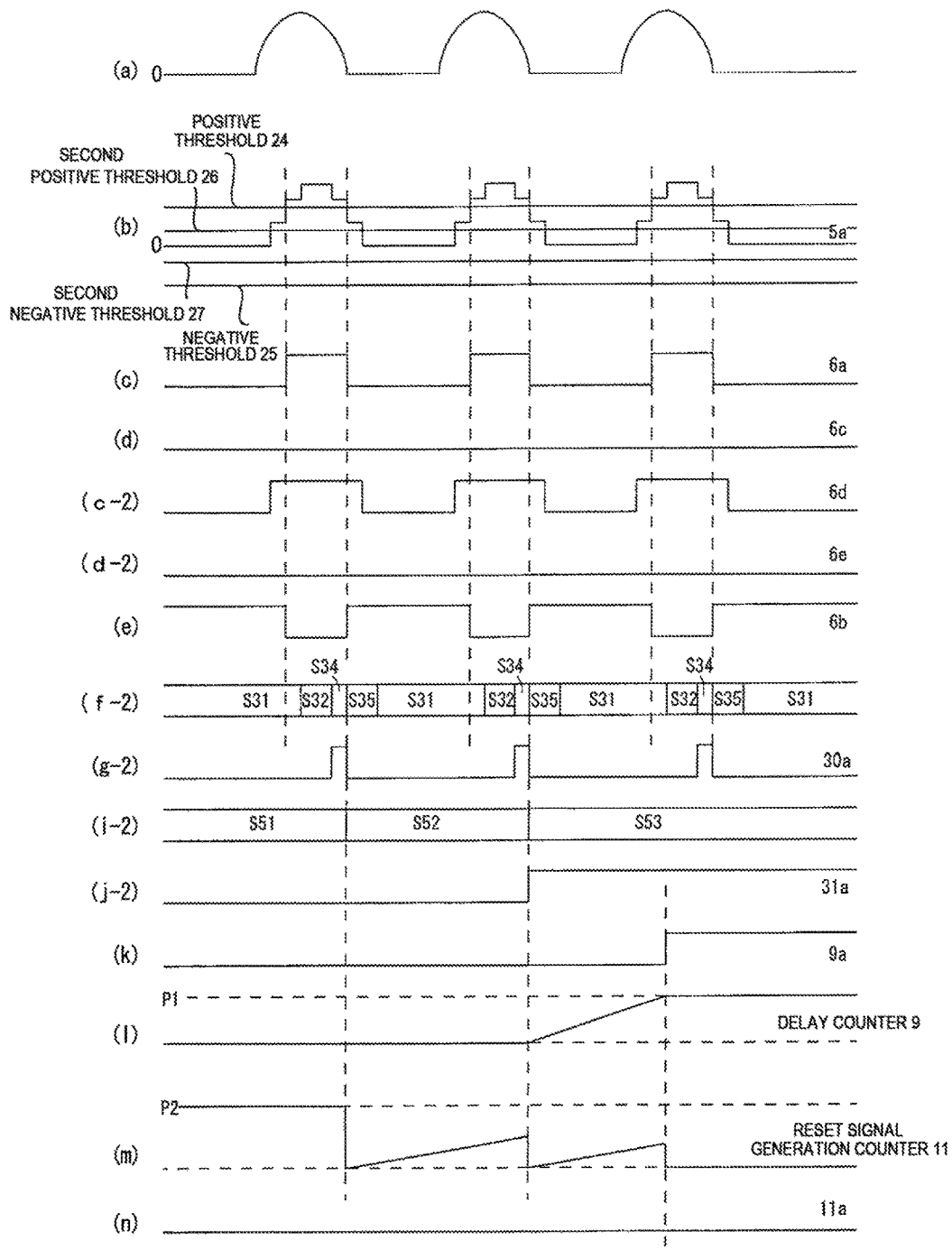
FIG. 13 is a timing chart illustrating an electric leakage detecting operation of the electric leakage detecting device shown in FIG. 10 at the occurrence of a half-wave-rectified electric leakage waveform.

The digital comparator 6 employed in this embodiment outputs a positive-threshold-excess detection signal 6a, a negative-threshold-excess detection signal 6c, and a between-thresholds detection signal 6b if the level of the output signal 5a is higher than a positive threshold 24, lower than a negative threshold 25, and between the positive threshold 24 and the negative threshold 25, respectively, and, in addition, outputs a second-positive-threshold-excess detection signal 6d and a second-negative-threshold-excess detection signal 6e if the level of the output signal 5a is higher than a second positive threshold 26 that is lower than the positive threshold 24 and if the level of the output signal 5a is lower than a second negative threshold 27 that is higher than the negative threshold 25, respectively. The second positive threshold 26 and the second negative threshold 27 are shown in FIG. 13.

The rectified-waveform trip control signal generator 30 receives a second-positive-threshold-excess detection signal 6d and a second-negative-threshold-excess detection signal 6e in addition to the positive-threshold-excess detection signal 6a, the between-thresholds detection signal 6b, and the negative-threshold-excess detection signal 6c. The rectified-waveform trip control signal generator 30 outputs a positive trip control signal 30a and a native side trip control signal 30b not only to the rectified-waveform electric leakage judging device 31 but also to the reset signal generation counter 11 via OR circuits 30A and 30B. The rectified-waveform electric leakage judging device 31 outputs an electric leakage judgment signal 31a to the delay counter 9 via an OR circuit 8A.

Figure 11:
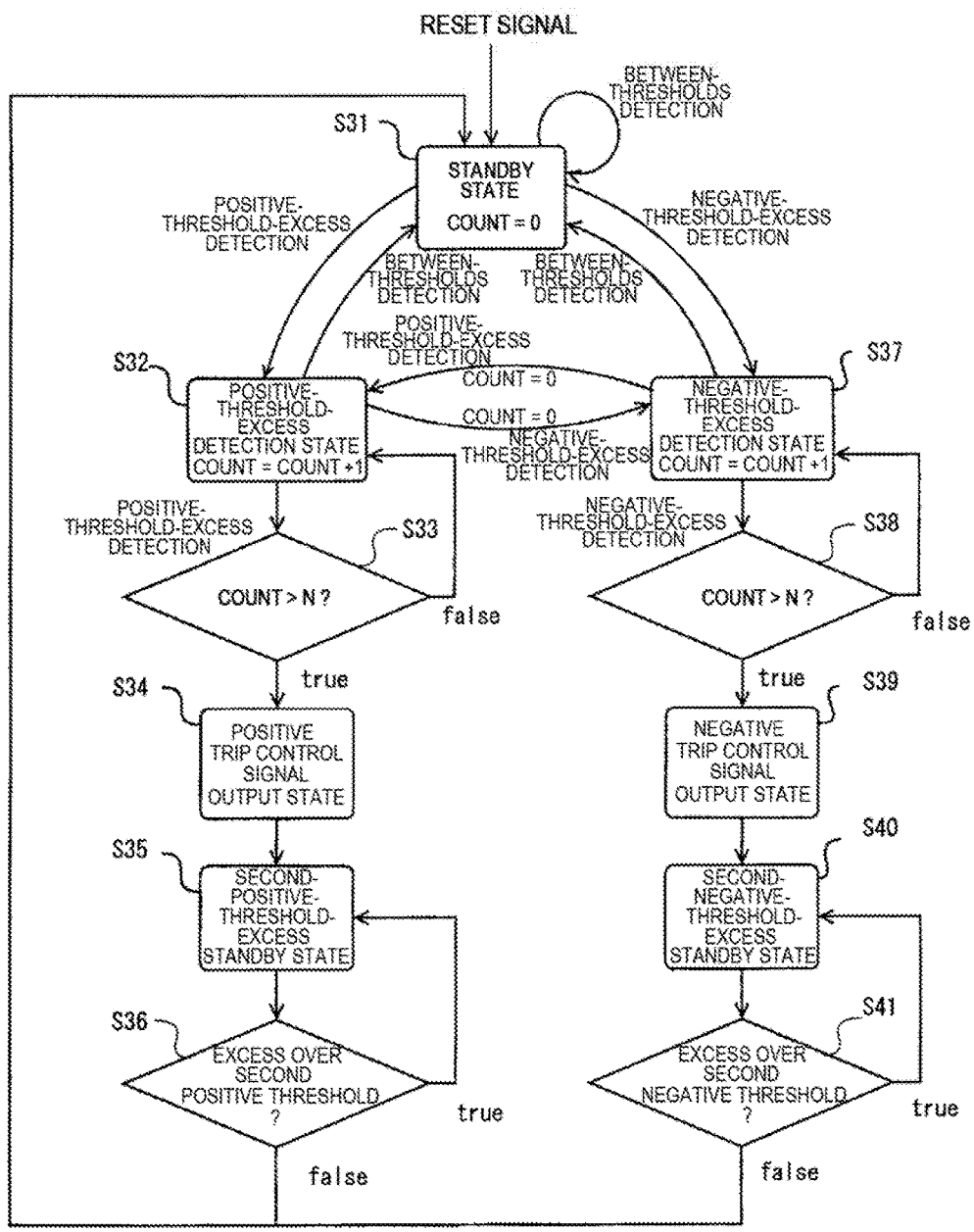
FIG. 11 is a state transition diagram of a rectified-waveform trip control signal generator of the electric leakage detecting device shown in FIG. 10.

FIG. 11 is a state transition diagram of a state machine that is part of the rectified-waveform trip control signal generator 30. The rectified-waveform trip control signal generator 30 is composed of the state machine shown in FIG. 11 and a built-in counter that is controlled by the state machine. The rectified-waveform trip control signal generator 30 is controlled by the positive-threshold-excess detection signal 6a, the between-thresholds detection signal 6b, the negative-threshold-excess detection signal 6c, the second-positive-threshold-excess detection signal 6d, and the second-negative-threshold-excess detection signal 6e of the digital comparator 6.

Upon input of a positive-threshold-excess detection signal 6a, a transition is made from a standby state S31 to a positive-threshold-excess detection state S32. If it is judged at step S33 that the positive-threshold-excess detection signal 6a has been input continuously for a period (third prescribed time) when the built-in counter has counted N pulses of the clock signal 13a, a transition is made to a positive trip control signal output state S34 and a positive trip control signal 30a is output there. Then a second-positive-threshold-excess standby state S35 is maintained as long as it is judged at step S36 that a second-positive-threshold-excess detection signal 6d is being received, even if the positive-threshold-excess detection signal 6a comes not to be received.

Upon input of a negative-threshold-excess detection signal 6c, a transition is made from the standby state S31 to a negative-threshold-excess detection state S37. If it is judged at step S38 that the negative-threshold-excess detection signal 6c has been input continuously for a period (third prescribed time) when the built-in counter has counted N pulses of the clock signal 13a, a transition is made to a negative trip control signal output state S39 and a negative trip control signal 30b is output there. Then a second-negative-threshold-excess standby state S40 is maintained as long as it is judged at step S41 that a second-negative-threshold-excess detection signal 6e is being received, even if the negative-threshold-excess detection signal 6c comes not to be received.

If a negative-threshold-excess detection signal 6c is input in the positive-threshold-excess detection state S32, the built-in counter is reset to "0" and a transition is made to the negative-threshold-excess detection state S37. If a positive-threshold-excess detection signal 6a is input in the negative-threshold-excess detection state S37, the built-in counter is reset to and a transition is made to the positive-threshold-excess detection state S32. If a between-thresholds detection signal 6b is input in the positive-threshold-excess detection state S32 or the negative-threshold-excess detection state S37, the built-in counter is reset to "0" and a transition is made to the standby state S31.

After the level of an electric leakage waveform exceeds the positive threshold 24, the rectified-waveform trip control signal generator 30 does not generate a second-time positive trip control signal 30a unless the level of the waveform becomes lower than the second positive threshold 26. That is, the built-in counter is reset to "0" and a transition is made to the standby state S31 only when the output signal 5a the digital filter 5 becomes lower than the second positive threshold 26.

Likewise, after the level of an electric leakage waveform becomes lower than the negative threshold 25, the rectified-waveform trip control signal generator 30 does not generate a second-time negative trip control signal 30b unless the level of the waveform exceeds the second negative threshold 27. That is, the built-in counter is reset to "0" and a transition is made to the standby state S31 only when the output signal 5a of the digital filter 5 outputs an output signal 5a exceeds the second negative threshold 27.

These operations make it possible to detect even a ground-fault current having a rectified waveform, that is, having only one polarity, and thus provide an effect of suppressing erroneous detection due to an undesirable waveform other than a ground-fault signal or a DC to low-frequency component signal that cannot be eliminated by the digital filter 5 disposed upstream, other than a ground-fault signal.

Figure 12:
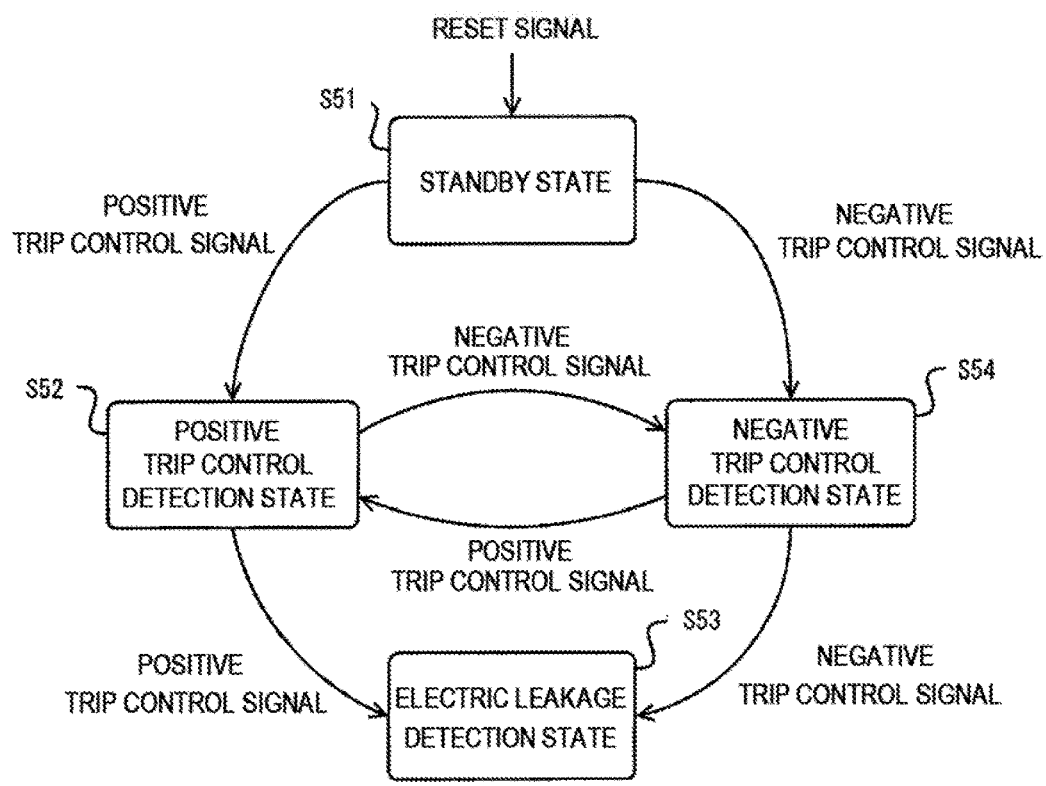
FIG. 12 is a state transition diagram of a rectified-waveform electric leakage judging device of the electric leakage detecting device shown in FIG. 10.

FIG. 12 is a state transition diagram of a state machine that constitutes the rectified-waveform electric leakage judging device 31. The rectified-waveform electric leakage judging device 31 is controlled by the positive trip control signal 30a and the negative trip control signal 30b which are output from the rectified-waveform trip control signal generator 30.

In this state machine, a transition is made to a positive trip control detection state S52 when a positive trip control signal 30a is generated in a standby state S51. If a positive trip control signal 30a is generated immediately thereafter, a transition is made to an electric leakage detection state S53.

On the other hand, a transition is made to a negative trip control detection state S54 when a negative trip control signal 30b is generated in the standby state S51. If a negative trip control signal 30b is generated immediately thereafter, a transition is made to the electric leakage detection state S53.

When a negative trip control signal 30b is generated in the positive trip control detection state S52, a transition is made to the negative trip control detection state S54. When a positive trip control signal 30a is generated in the negative trip control detection state S54, a transition is made to the positive trip control detection state S52.

As described above, the rectified-waveform electric leakage judging device 31 makes a transition to the electric leakage detection state S53 and outputs an electric leakage judgment signal 31a only when two positive trip control signals 30a or two negative trip control signals 30b are generated successively. After the transition to the electric leakage detection state S53, the electric leakage detection state S53 is maintained until generation of a reset signal 11a.

Next, how the electric leakage detecting device shown in FIG. 10 operates will be described with reference to a timing chart of FIG. 13 FIG. 13 is a timing chart illustrating an operation for detecting a half-wave-rectified electric leakage waveform. Part (a) of FIG. 13 shows a difference voltage between positive and negative output signals of the zero-phase current transformer 2 that is proportional to a ground-fault current occurring in the AC electric circuit 1. Part (b) of FIG. 13 shows an output signal 5a of the digital filter 5 that is generated through modulation by the ΔΣ modulator 4 and processing by the digital filter 5.

Parts (c), (d), (c-2), and (d-2) of FIG. 13 show a positive-threshold-excess detection signal 6a, a negative-threshold-excess detection signal 6c, a second positive-threshold-excess detection signal 6d, and a second negative-threshold-excess detection signal 6e, respectively. These output signals 6a, 6b, 6c, 6d, and 6e of the digital comparator 6 cause the state machine of the rectified-waveform trip control signal generator 30 to make state transitions shown in part (f-2) of FIG. 13.

Since the state machine of the rectified-waveform trip control signal generator 30 makes transitions as shown in FIG. 11, the rectified-waveform trip control signal generator 30 outputs, as a pulse signal, a positive trip control signal 30a shown in part (g-2) of FIG. 13 if the rectified-waveform trip control signal generator 30 detects excess over the positive threshold 24 continuously until the built-in counter counts N pulses (until the third prescribed time has lapsed) of the clock signal 13a. The rectified-waveform trip control signal generator 30 is kept in the second-positive-threshold-excess standby state S35 until the level of the output signal 5a of the digital filter 5 becomes lower than the second positive threshold 26.

Positive trip control signals 30a cause the state machine of the rectified-waveform electric leakage judging device 31 to make transitions shown in part (i-2) of FIG. 13. Since the state machine of the rectified-waveform electric leakage judging device 31 makes transitions as shown in FIG. 12, when receiving two positive trip control signal 30a successively, the rectified-waveform electric leakage judging device 31 makes a transition to the electric leakage detection state and outputs an electric leakage judgment signal 31a shown in part (j-2) of FIG. 13.

In the second embodiment, since not only is an electric leakage judgment signal 31a generated as described above but also an electric leakage judgment signal 8a is generated as described in the first embodiment upon occurrence of an ordinary electric leakage, the AC electric circuit 1 can be shut off whether an ordinary electric leakage or an electric leakage having a rectified waveform has occurred and occurrence of an undesired operation due to harmonic noise, a surge, or an abnormal waveform can be suppressed.

The invention claimed is:

1. An electric leakage detecting device for shutting off an AC electric circuit by detecting a ground-fault current occurring in the AC electric circuit by a zero-phase current transformer, the electric leakage detecting device including:
   an A/D converter which analog-to-digital-converts a difference signal between positive and negative output signals of the zero-phase current transformer;
   a digital filter which extracts low-frequency components of a digital signal that is output from the A/D converter;
   a digital comparator which generates a detection signal by comparing an output signal of the digital filter with the positive threshold and the negative threshold;
   a trip control signal generator which generates a positive trip control signal or a negative trip control signal based on the detection signal output from the digital comparator;
   an electric leakage judging device which judges whether the AC electric circuit is in an electric leakage state based on the positive trip control signal and the negative trip control signal, and generates an electric leakage judgment signal if judging that the AC electric circuit is in the electric leakage state;
   a delay counter which generates a final trip control signal if the electric leakage judgment signal has been received continuously from the electric leakage judging device more than a first prescribed time;
   a reset signal generation counter which is reset every time the positive trip control signal or the negative trip control signal is received from the trip control signal generator, and resets the electric leakage judging device and the delay counter it neither the positive trip control signal nor the negative trip control signal is received in a second prescribed time after being reset; and
   a switch driving circuit which shuts off the AC electric circuit when the final trip control signal is received from the delay counter.

2. The electric leakage detecting device of claim 1, wherein the digital filter eliminates frequency components that are higher than a main frequency of the AC electric circuit.

3. The electric leakage detecting device of claim 1, wherein the digital comparator generates, as the detection signal,
   a positive-threshold-excess detection signal when the output signal of the digital filter is larger than the positive threshold, and
   a negative-threshold-excess detection signal when the output signal of the digital filter is smaller than the negative threshold,
   wherein the trip control signal generator includes a time measuring unit, and generates
      the positive trip control signal if the time measuring unit detects that the positive-threshold-excess detection signal has been received continuously for a third prescribed time, and
      the negative trip control signal if the time measuring unit detects that the negative-threshold-excess detection signal has been received continuously for the third prescribed time, and
   wherein the electric leakage judging device generates the electric leakage judgment signal if the positive trip control signal and the negative trip control signal are received from the trip control signal generator
      in an order of the positive trip control signal, the negative rip control signal and the positive trip control signal, or
      in an order of the negative trip control signal, the positive trip control signal and the negative trip control signal.

4. The electric leakage detecting device of claim 3, wherein the trip control signal generator is reset into a standby state to wait for input of the positive-threshold-excess detection signal or the negative-threshold-excess detection signal if the negative-threshold-excess detection signal is received after generation of the positive trip control signal, or if the positive-threshold-excess detection signal is received after generation of the negative trip control signal.

5. The electric leakage detecting device of claim 1, wherein the digital comparator generates, as the detection signal,
   a positive-threshold-excess detection signal when the output signal of the digital filter is larger than the positive threshold, and
   a negative-threshold-excess detection signal when the output signal of the digital filter is smaller than the negative threshold,
   wherein the trip control signal generator includes a time measuring unit, and generates
      the positive trip control signal if the time measuring unit detects that the positive-threshold-excess detection signal has been received continuously for a third prescribed time, and
      the negative trip control signal if the time measuring unit detects that the negative-threshold-excess detection signal has been received continuously for the third prescribed time, and
   wherein the electric leakage judging device generates the electric leakage judgment signal if
      the positive trip control signal is received successively twice from the trip control signal generator, or
      the negative trip control signal is received successively twice from the trip control signal generator.

6. The electric leakage detecting device of claim 5, wherein the digital comparator further includes a second positive threshold that as smaller than the positive threshold and a second negative threshold that is larger than the negative threshold, and generates
   a second-positive-threshold-excess detection signal when the output signal of the digital filter is larger than the second positive threshold, or
   a second-negative-threshold-excess detection signal when the output signal of the digital filter is smaller than the second negative threshold, and
   wherein the trip control signal generator is reset into a standby state to wait for input of the positive-threshold-excess detection signal or the negative-threshold-excess detection signal, if the second-positive-threshold-excess detection signal is not received after generation of the positive trip control signal or if the second-negative-threshold-excess detection signal is not received after generation of the negative trip control signal.

7. The electric leakage detecting device of claim 3,
wherein the digital comparator further generates
- a between-thresholds detection signal when the output signal of the digital filter is between the positive threshold and the negative threshold, and wherein the trip control signal generator is
- switched into a detection state to start measurement of a continuation time of the negative-threshold-excess detection signal with the time measuring unit being reset, if the detection signal of the digital comparator is changed from the positive-threshold-excess detection signal to the negative-threshold-excess detection signal before the time measuring unit detects a lapse of the third prescribed time,
- switched into a detection state to start measurement of a continuation time of the positive-threshold-excess detection signal with the time measuring unit being reset, if the detection signal of the digital comparator is changed from the negative-threshold-excess detection signal to the positive-threshold-excess detection signal before the time measuring unit detects a lapse of the third prescribed time, and
- reset into a standby state to wait for input of the positive-threshold-excess detection signal or the negative-threshold-excess detection signal if the detection signal of the digital comparator is changed from the positive-threshold-excess detection signal or the negative-threshold-excess detection signal to the between-thresholds detection signal.

\* \* \* \* \*